United States Patent
Akinmade-Yusuff et al.

(10) Patent No.: US 7,470,616 B1
(45) Date of Patent: Dec. 30, 2008

(54) DAMASCENE WIRING FABRICATION METHODS INCORPORATING DIELECTRIC CAP ETCH PROCESS WITH HARD MASK RETENTION

(75) Inventors: Hakeem S. B. Akinmade-Yusuff, Beacon, NY (US); Kaushik A. Kumar, Beacon, NY (US); Anthony D. Lisi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/121,378

(22) Filed: May 15, 2008

(51) Int. Cl.
*H01L 21/4763* (2006.01)
(52) U.S. Cl. ............... 438/637; 438/620; 257/E23.145
(58) Field of Classification Search .......... 438/637, 438/620; 257/E23.145
See application file for complete search history.

(56) References Cited

U.S. PATENT DOCUMENTS

| | | | |
|---|---|---|---|
| 6,221,772 B1 | 4/2001 | Yang et al. | |
| 6,720,249 B1* | 4/2004 | Dalton et al. | 438/624 |
| 7,045,464 B1 | 5/2006 | Biolsi et al. | |
| 7,129,159 B2* | 10/2006 | America et al. | 438/618 |
| 7,282,441 B2 | 10/2007 | Fuller et al. | |
| 7,332,428 B2 | 2/2008 | Beck | |
| 2002/0111041 A1 | 8/2002 | Annapragada et al. | |
| 2006/0068592 A1 | 3/2006 | Dostalik | |
| 2006/0099785 A1 | 5/2006 | Fuller et al. | |
| 2006/0105572 A1 | 5/2006 | Biolsi et al. | |
| 2007/0134917 A1* | 6/2007 | Li et al. | 438/637 |
| 2007/0166648 A1 | 7/2007 | Ponoth et al. | |
| 2007/0190718 A1* | 8/2007 | Coolbaugh et al. | 438/253 |
| 2007/0193602 A1 | 8/2007 | Savas et al. | |
| 2007/0228570 A1 | 10/2007 | Dimitrakopoulos et al. | |
| 2007/0231993 A1 | 10/2007 | Fukasawa et al. | |
| 2007/0275552 A1 | 11/2007 | Clevenger et al. | |
| 2007/0298604 A1 | 12/2007 | Liu et al. | |

* cited by examiner

*Primary Examiner*—B William Baumeister
*Assistant Examiner*—Steven J. Fulk
(74) *Attorney, Agent, or Firm*—Keusey, Tutunjian & Bitetto, P.C.

(57) ABSTRACT

Methods for fabricating metal wiring layers of a semiconductor device are provided where damascene interconnect structures are formed in a BEOL process that incorporates a dielectric cap-open-first process to achieve hard mask retention and to control the gouging of a buffer oxide layer to prevent exposure of underlying features protected by the buffer oxide layer.

1 Claim, 7 Drawing Sheets

DAMASCENE WIRING FABRICATION METHODS INCORPORATING DIELECTRIC CAP ETCH PROCESS WITH HARD MASK RETENTION

TECHNICAL FIELD

The present invention relates generally to methods for fabricating metal wiring layers of a semiconductor device and, in particular, to methods for forming dual damascene interconnect structures in which a dielectric cap-open-first process is utilized to achieve hard mask retention and to control the gouging of a buffer oxide layer to prevent exposure of underlying features protected by the buffer oxide layer.

BACKGROUND

An integrated circuit (IC) device may be formed with millions of transistors and other circuit elements that are fabricated on a single silicon crystal substrate (wafer). For the IC device to be functional, multi-level or multi-layered interconnection schemes such as, for example, dual damascene wiring (interconnect) structures, are fabricated using BEOL (back end of line) techniques to connect the circuit elements distributed on the surface of the device.

In general, damascene techniques involve depositing an interlevel dielectric (ILD) layer, such as silicon dioxide, forming an opening in the ILD, overfilling the opening with a metal such as copper (Cu), and removing excess metal using chemical mechanical polishing (CMP), resulting in a planarized interconnect structure. This results in a single wiring level or interconnect level of an overall interconnect structure having many wiring levels. The opening in the interconnect level may be a trench running essentially parallel to the surface of the integrated circuit (IC) chip, and a filled trench is referred to as a "wire" or a "line". A wire is used to route signals from a first location on the wafer to a second location remote from the first location. The trench for forming the wire may extend only partially (e.g., halfway) into the thickness of the ILD, from the top surface thereof.

Alternatively, an opening in the interconnect level may be a via, extending perpendicular to the surface of IC completely through the ILD for connecting an overlying wire of a higher wiring level or of the present wiring level to an underlying wire of a lower wiring level. A filled via is typically simply referred to as a via or as a plug particularly when connecting to an underlying first metallization (M1) or to an element of an underlying MOS (metal oxide semiconductor) structure.

In dual damascene techniques, the opening in the ILD comprises a lower contact or via hole portion in communication with an upper trench portion, and both the via and the trench portions are simultaneously filled. There are three main sequences (via-first, trench-first, buried-via) for forming dual-damascene differing in the sequence in which the via and trench are patterned and etched, but the resulting structure is generally the same for all three.

As technology nodes reach 45 nm and beyond, BEOL technologies must be continuously optimized through changes in process flows and material used in order to build high performance structures. For exampler as critical dimensions decrease, etching of small profiles using thin masking layers becomes increasingly problematic with regard to etch profile control (controlling shape of hole or trench being formed), control of etching damage and residues, and control of critical dimensions such as line edge roughness (LER) and line width roughness (LWR). Moreover, the control of uniformity and variability also becomes increasingly problematic where microloading, caused by different etch rates for densely packed features verses open or isolated features, results in non-uniformity.

As the semiconductor fabrication industry moves towards the 32 nm device generation, thinner photoresist layers are needed to, e.g., enable and extend lithographic printing, which is driving increased use of thinner hard masks and more complex processes, such as bilayer resists. With regard to BEOL processing where damascene patterning is done by etching holes and vias in low-k dielectrics, there are challenges that must be faced in managing the impact of using various types of etch stops and hard masks and different process flows (i.e., via-first vs. trench-first) on factors such as damage, variability and effective k ($k_{eff}$) value. Moreover, etching process flows are more problematic due to increasingly complex material stacks that are needed for BEOL fabrication, wherein in advanced devices, there can be 8 or more layers of materials which must be etched for BEOL fabrication, including, for example, photoresist layers, hard mask layers, antireflective coatings (ARCs), capping layers and etch-stop layers, and porous low-k dielectric.

SUMMARY OF THE INVENTION

Exemplary embodiments of the invention generally relate to methods for fabricating metal wiring layers of a semiconductor device and, The present invention relates generally to methods for fabricating metal wiring layers of a semiconductor device and, in particular, to methods for forming dual damascene interconnect structures in which a dielectric cap-open-first process is utilized to achieve hard mask retention and to control the gouging of a buffer oxide layer to prevent exposure of underlying features protected by the buffer oxide layer.

In one exemplary embodiment of the invention, a method of forming an interconnect structure includes:

forming an oxide layer over a surface of a semiconductor substrate having a metallic contact formed in the substrate surface, wherein an upper surface of the metallic contact is coplanar with an upper surface of the oxide layer;

forming a nitride capping layer over the oxide layer;

forming an interlevel dielectric (ILD) layer over the nitride capping layer;

forming a hard mask layer over the ILD layer;

sequentially forming an organic planarizing layer (OPL), anti reflective coating (ARC) layer and photoresist (PR) layer over the hard mask layer;

etching first and second openings through the PR, ARC, OPL, hard mask and ILD layers down to the nitride capping layer, wherein the first opening is aligned to the metallic contact in the underlying substrate surface;

etching the nitride capping layer exposed at bottoms of the first and second openings using the PR, ARC or OPL layer as an etch mask to a portion of the upper surface of the metallic contact through the first opening and to expose at least a portion of the upper surface of the oxide layer through the second opening;

stripping away any remaining portion of the PR, ARC and OPL layers to expose the hard mask layer; subsequent to the etching of the nitride capping layer; and performing a controlled oxide gouging of the exposed surface of the oxide layer in the second opening to avoid punch through of the oxide layer to an underlying layer or feature.

These and other exemplary embodiments, features and advantages of the present invention will be described or become apparent from the following detailed description of exemplary embodiments, which is to be read in connection with the accompanying drawings

DETAILED DESCRIPTION OF EXEMPLARY EMBODIMENTS

Figure 1:
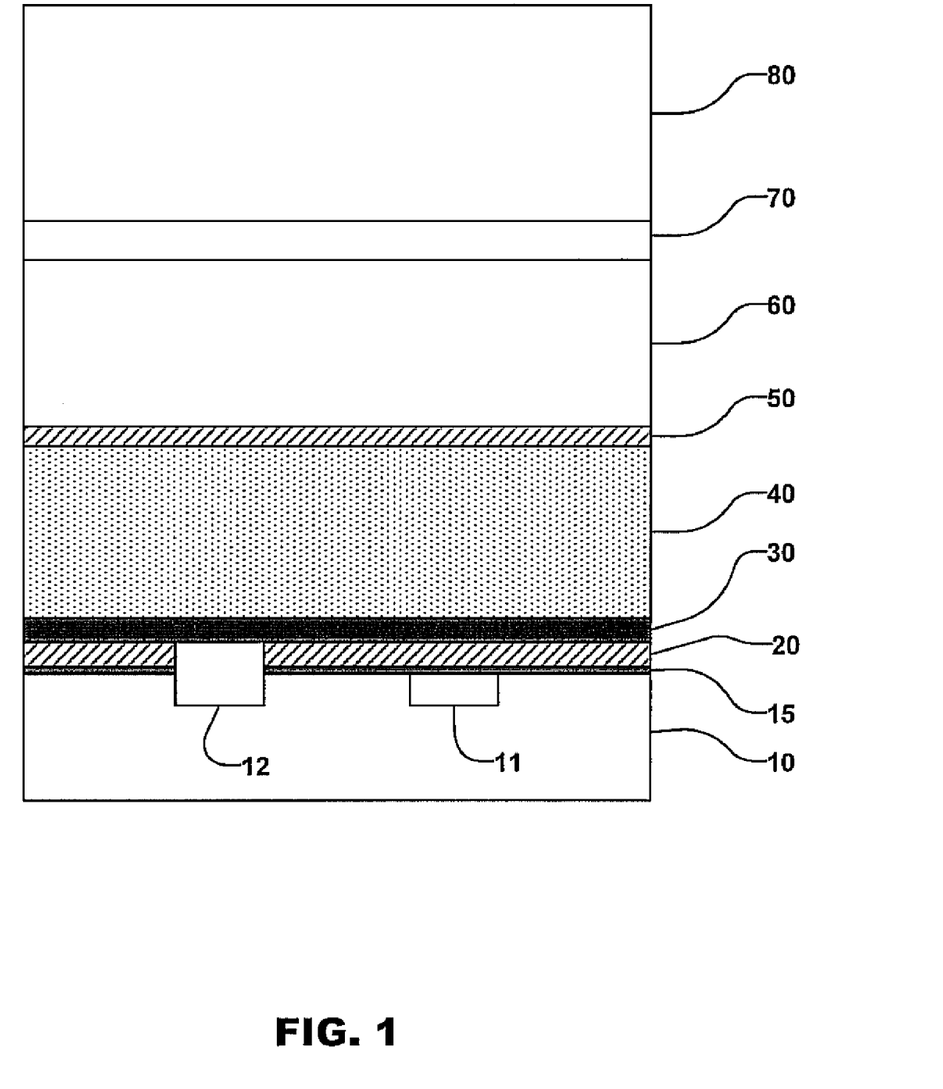
FIG. 1 schematically illustrates a partially fabricated integrated circuit device comprising stacked layers for performing a BEOL etch process, according to an exemplary embodiment of the invention.

FIG. 1 schematically illustrates a partially fabricated integrated circuit device comprising stacked layers for performing a BEOL etch process, according to an exemplary embodiment of the invention. In particular, FIG. 1 schematically illustrates a partially fabricated integrated circuit device including a substrate (10) in which a plurality of circuit features (11) and (12) are formed within a dielectric layer on the active surface of the substrate (10) or within a given layer of a BEOL structure. For example, the circuit feature (11) may be some circuit element or component that is formed on the active surface of the substrate (10) or within the BEOL structure over the active surface of the substrate (10). The feature (12) may be a conductive via, plug or wire formed as part of a lower BEOL layer to which contact is made by forming a via or line in an upper BEOL layer. The feature (12) may be an electrode formed on a source or drain region of a MOSFET (metal oxide semiconductor, field effect transistor).

Moreover, a plurality of layers are sequentially formed over the substrate (10) forming a stack comprising a thin nitride layer (15), a thin oxide layer (20), a capping layer (30), an ILD (inter level dielectric) layer (40), a hard mask layer (50), an OPL (organic planarizing layer) (60), an Anti-Reflective Coating (ARC) layer (70), and a photoresist (PR) layer (80) are sequentially deposited over the hard mask layer (50).

The nitride layer (15) may be a thin layer of silicon nitride. The oxide layer (20) acts as a buffer layer for a subsequent via etch process (described below) to prevent exposure of underlying features (11). The tope surface of feature (12) (e.g., via or wire) is coplanar with the top surface of the oxide layer (20). The oxide layer (20) may be a silicon dioxide layer or a dense oxide layer having a thickness of about 300 to about 500 angstroms, and having a high etching selectivity with respect to the capping layer (30). As explained below, an etch process flow according to an exemplary embodiment of the invention employed to minimize the effects of microloading and allows control of the amount of oxide gouging that occurs in the oxide layer (20) during etching to achieve good hard mask retention.

The capping layer (30) may be formed of a nitride material, silicon nitride, silicon carbide, or SiCN (nitrided silicon carbide). In one preferred embodiment, the cap layer (30) is formed from a nitride material such as a SiCN material, such as NBLoK. The cap layer (30) is deposited to a thickness of between about 10 nm and about 60 nm, preferably about 25 nm. The capping layer (30) acts as a diffusion barrier layer to prevent/reduce diffusion of the metallic material into the ILD layer (40). The capping layer (30) also provides an etch control layer during an RIE etch process to provide at level etch control for RIE lag caused by aspect ratio dependent etching.

In one exemplary embodiment, the ILD layer (40) is preferably formed of a low-k dielectric material. The ILD layer (40) may be formed of an organic polymer material or an inorganic material. More specifically, the ILD layer (40) may be formed of a silicon oxide layer doped with carbon, fluorine or hydrogen atoms, e.g., a silicon oxycarbide (SiOC) layer, a SiOCH layer, a fluoro-silses-quioxane (FSQ) layer, a hydro-silses-quioxane (HSQ) layer or a methyl-silses-quioxane (MSQ) layer. Whatever materials are used for the cap layer (30) and ILD layer (40), the ILD layer (40) is preferably formed of a material having a high etching selectivity with respect to the capping layer (30) and having a low dielectric constant. The ILD layer (40) can have a thickness of between about 140 nm.

In one exemplary embodiment, the hard mask layer (50) is made with an oxide material. The hard mask layer (50) is formed, initially, as thin as possible preferably 15 nm. The hard mask layer (50) is formed to protect the ILD layer (130) from being damaged during plasma processes and to act as a buffer layer for a subsequent CMP process. The hard mask layer (50) is preferably formed with a material having an etching selectivity with respect to the ILL layer (40). The hard mask layer (50) may be formed of a tantalum oxide (TaO) layer or a titanium oxide (TiO) layer, a TEOS layer, or a silicon layer such SiO2, or other materials such as SiOF and SiON, for example. As explained below, an etch process flow according to an exemplary embodiment of the invention is employed to minimize the hard mask loss and achieve good hard mask retention.

The organic planarizing layer (60) may be formed of any suitable organic-based material that can be blanket deposited to provide a planarizing layer for the subsequent photoresist layers. The ARC layer (70) may be formed of a SiARC to a thickness of about 45 nm or thinner, depending on the application and process capability. The photoresist layer (80) may be formed of any suitable photoresist material commonly used for photolithographic etching and formed to a thickness of about 120 nm.

Figure 2:
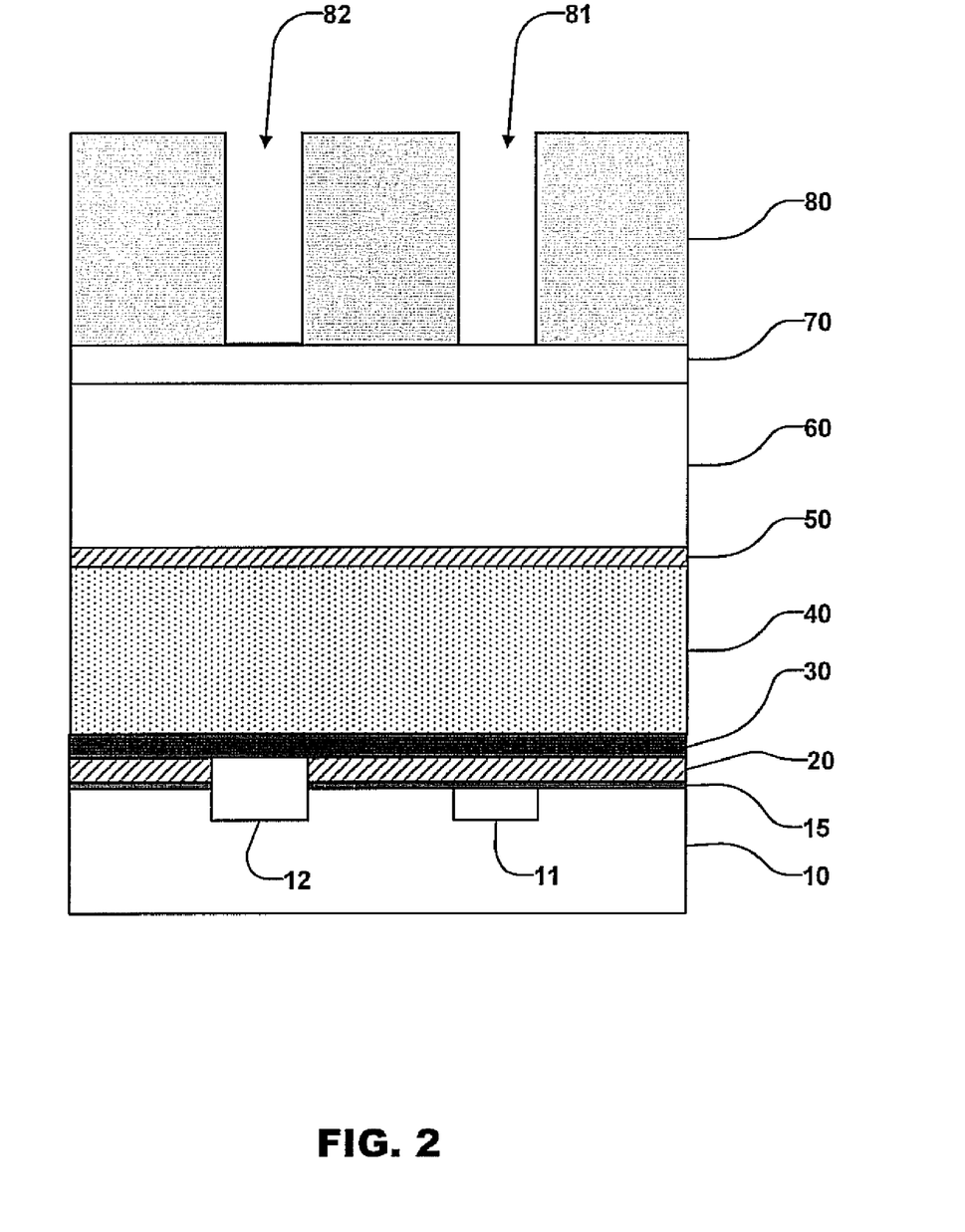
FIGS. 2-7 schematically illustrate various stages of an etch process for forming via holes/trenches in the BEOL dielectric stack depicted in FIG. 1, according to an exemplary embodiment of the invention.

FIGS. 2-7 illustrates various stages of an etch process for forming openings (for via holes or line trenches) in the dielectric stack depicted in FIG. 1. FIG. 2 illustrates a photolithographic patterning process in which a plurality of openings (81) and (82) are formed in the photoresist layer (80) down to the ARC layer (70) using known photolithographic techniques. The opening (81) may correspond to a line trench opening that is to be formed in the ILD layer (40), wherein it is assumed that the line trench (corresponding to opening 81) to be formed extends perpendicular to the plane of the drawing sheet and is to be connected to some via conductor (not shown) formed in the lower substrate level (10) and happens to be aligned to, and cross over, the underlying circuit feature (11) to be protected. The opening (82) may correspond to a via hole opening to be formed through the ILD layer (40) down to the in which a subsequent metal fill process forms a via contact that is electrically connected to an underlying metal pad or wire (12).

Figure 3:
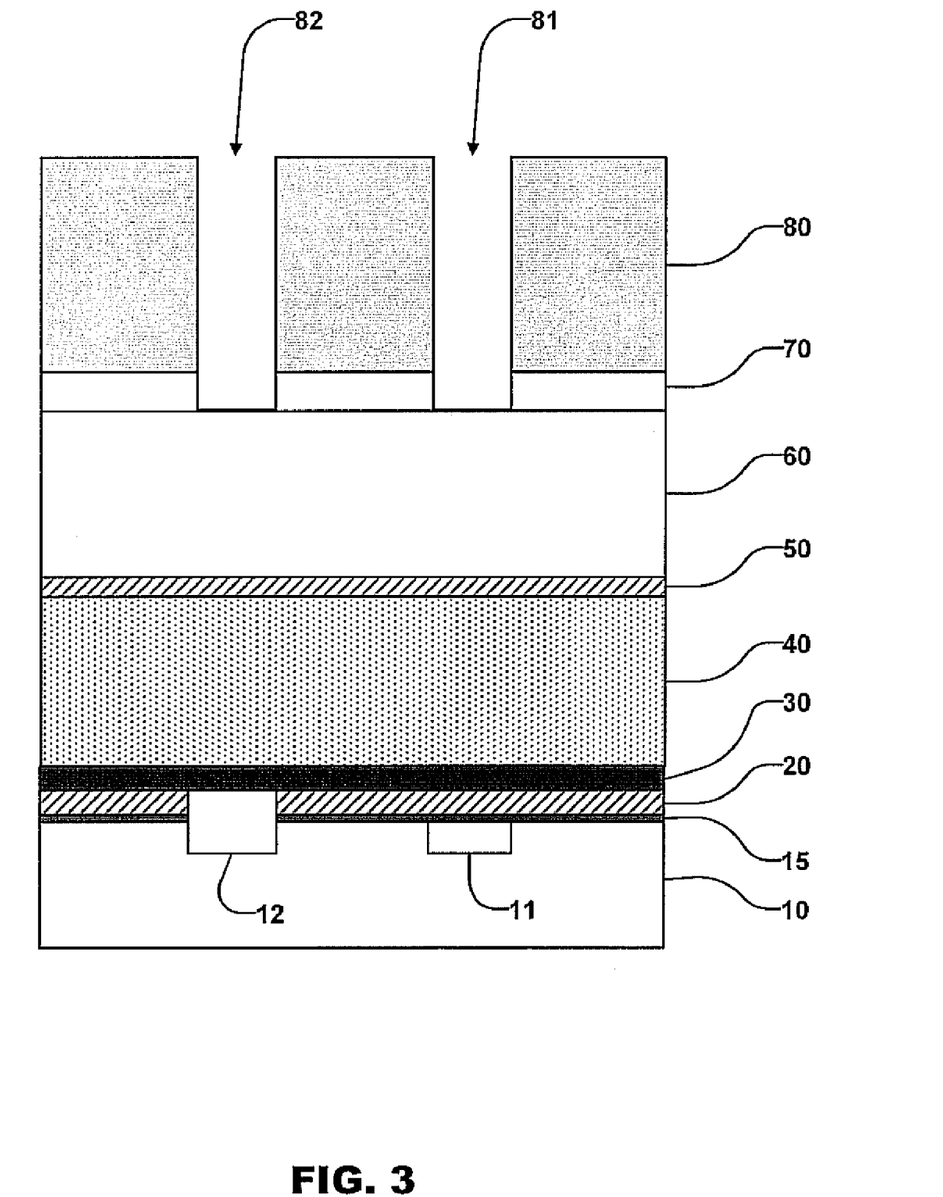

Next, as depicted in FIG. 3, an anisotropic etch process is performed to etch the exposed portions of the ARC layer (70) and extend the openings down to the OPL layer (60). This etch process may be a timed etch to extend the holes (81) down to a desired depth or may be end-pointed using end point detection to determined when the OPL layer (60) is reached.

Figure 4:
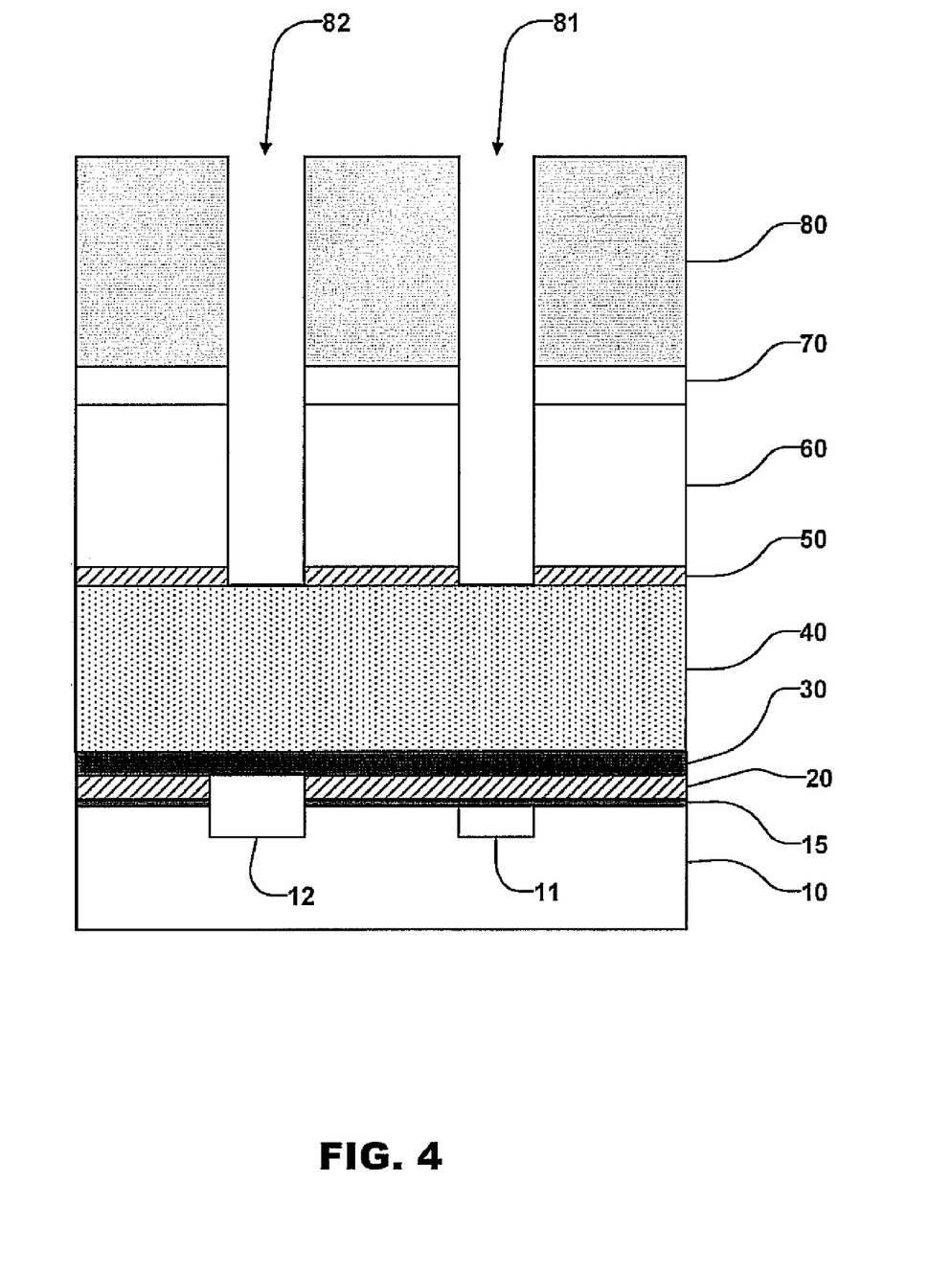

Next, as depicted in FIG. 4, one or more anisotropic etch processes are performed to etch the exposed portions of the OPL layer (60) and hard mask layer (50) and extend the bottoms of openings (81) and (82) down to the ILD layer (40) or down to some depth within the hard mask layer (50). The etching of the OPL (60) and hard mask (50) may be performed using known techniques and dry etching chemistries suitable for the materials used to form the layers (60) and (50). The etching process may be a timed etch to extend the openings (81) and (82) down to or within the hard mask layer (50) followed by a second etch to further extend the openings (81) and (82) down to the ILD layer (40). The desired depth or may be end-pointed using end point detection to determine when the ILD layer (40) is reached.

Figure 5:
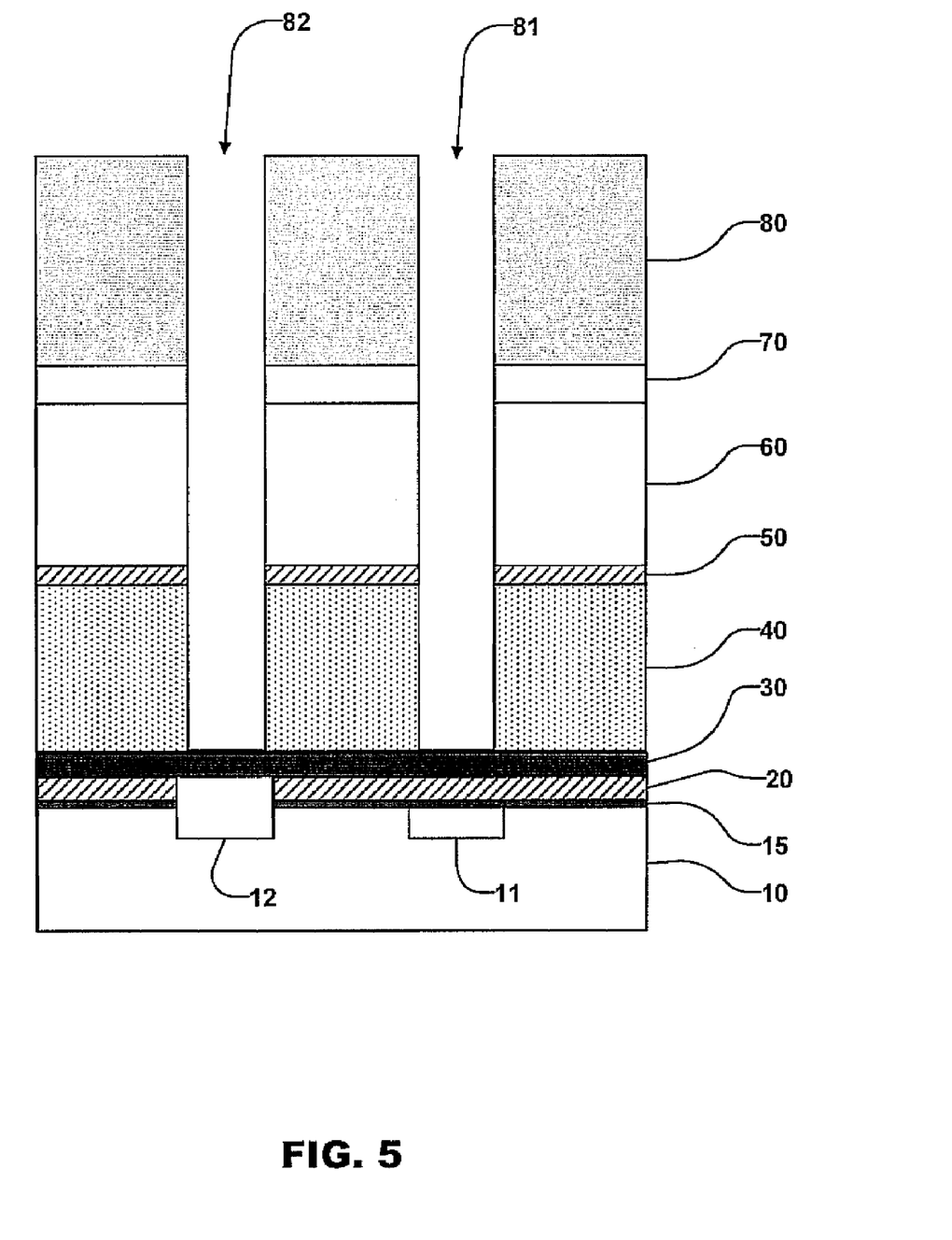

Next, as depicted in FIG. 5, an anisotropic dry etch process is performed to etch the exposed portions of the ILD layer (40) and extend the openings (81) and (82) down to the capping layer (30). The ILD layer (40) may be etched using a dry etch process (e.g., RIE) with an etch chemistry capable of etching the ILD material (40) selective to the material forming the capping layer (30). As noted above, the high selectivity etch allows the capping layer (30) to service as an etch control layer to counteract RIE lags resulting from aspect ratio dependent etching.

Figure 6:
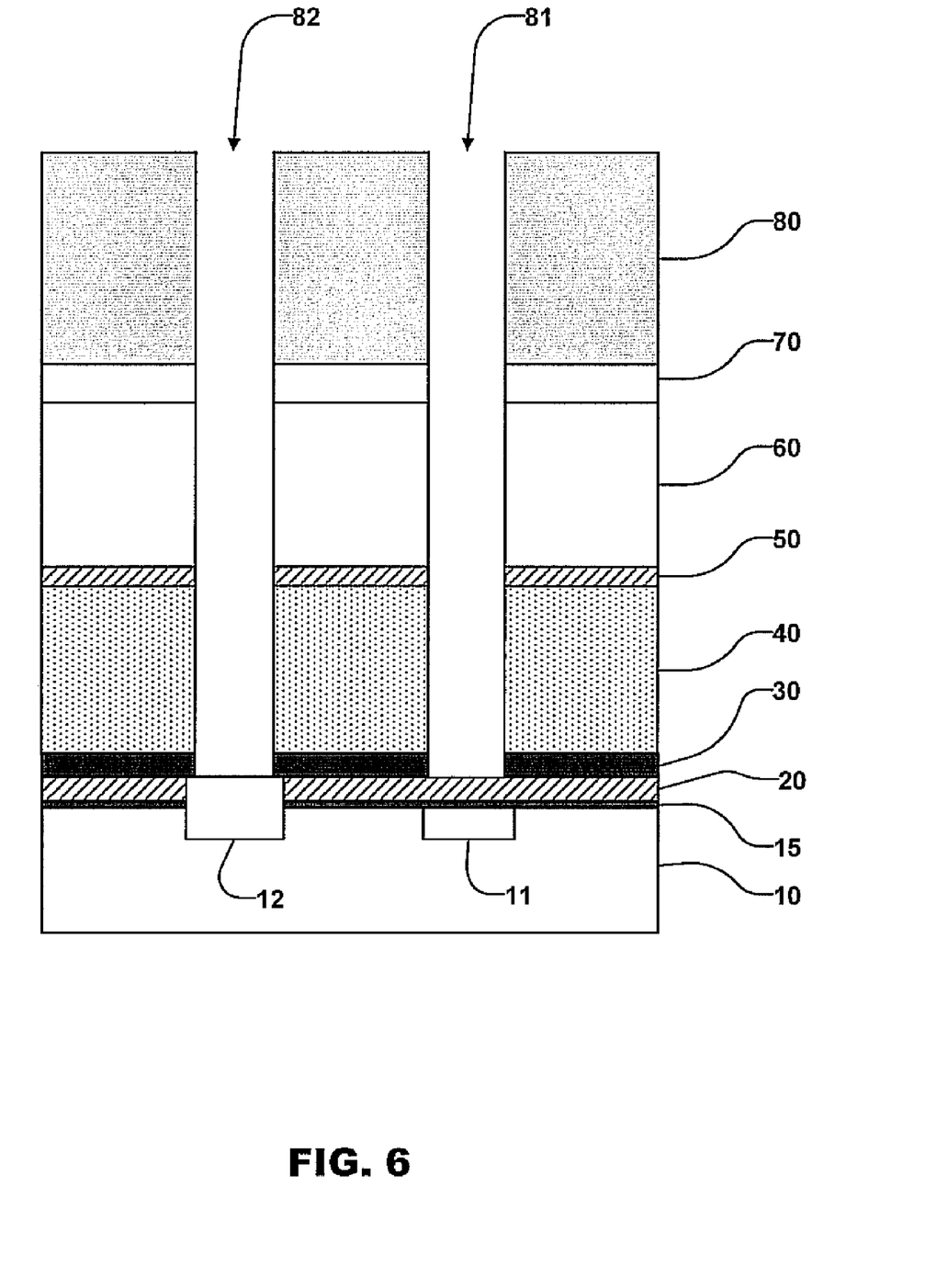

Next, as depicted in FIG. 6, a cap-open-first etch process is performed to etch the exposed portions of the capping layer (30) at the bottom of the openings (81) and (82). It is to be understood that the etching of the ILD layer (40) and capping layer (30) may be performed with a single dry etch process, under appropriately optimized conditions. In FIG. 6, the capping layer (30) is etched down to the oxide layer (20) using an anisotropic dry etch process (e.g., RIE) which is highly selective to the underlying oxide material (20).

It is to be appreciated that in contrast to conventional etch processing flows where any remaining portions of the photoresist layer (80), ARC layer (70) and OPL (60) would first be stripped after the ILD layer (40) etch, the etching of the capping layer (30) is performed before the stripping process to remove any remaining portions of the photoresist (80), ARC layer (70) and OPL layer (60). The cap-open-first etch process is performed so that the thin hard mask layer (50) is not used as an etch mask for etching the capping layer (30) and, thus, providing hard mask retention for subsequent processing steps. Moreover, because the etching of the capping layer (30) is selective to the underlying oxide layer (20), gouging of the oxide (20) is prevented or minimized during the etching of the capping layer (30) irrespective of microloading effects or RIE lag.

In FIGS. 2-6, a plurality of separate etch processes are applied to the structure of FIG. 1 using the photoresist, ARC and OPL layers as etching masks to sequentially etch the through the various layers (50), (40), and (30) down to the oxide layer (20). It should be noted that although the photoresist layer (80), ARC layer (70) and OPL layer (60) are shown in FIG. 6 as having the same thickness in FIG. 1 (as deposited), one of ordinary skill in the art would readily know that in reality, the prior etching processes (FIGS. 2-5) would most likely result in the etching away of all of the photoresist and ARC layers (80) and (70), and possibly a portion of the OPL layer (60).

Figure 7:
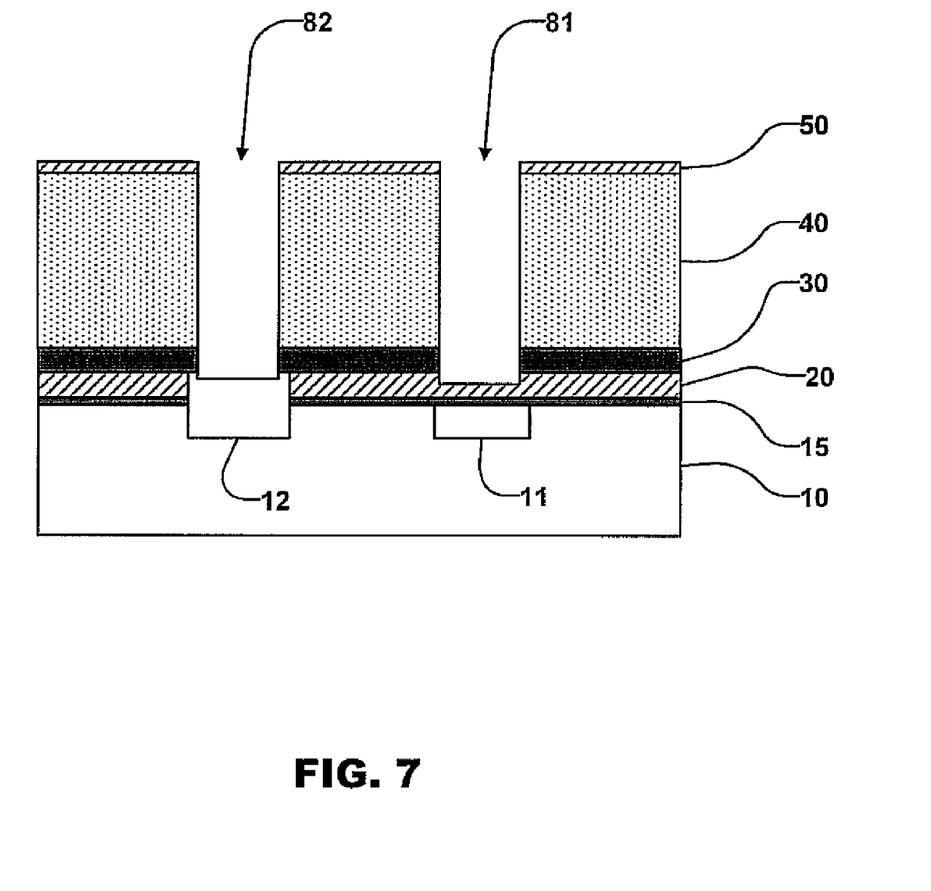

Next, FIG. 7 schematically illustrates the semiconductor device at a stage of fabrication after the cap-open etch process (FIG. 6) in which any remaining layer of photoresist, ARC and OPL is stripped away to exposed the hard mask layer (50) and the opening (81) is extended down to or within the top surface of the oxide layer (20) and the opening (82) is extended down to or within the surface of the wire/via plug/electrode feature (12). The cap-open-first process of FIG. 6 (before stripping) advantageously enables better control of oxide gouging of the oxide layer (20), wherein the bottom of the opening (81) can be controllably etched down to the surface or slight below (e.g., 20 nm) the surface of the oxide layer (20). This oxide gouging control prevents over etching of the oxide layer (20) which can result in punch through of the oxide layer (20) and expose the underlying features (11) (wherein the metal that fills the opening (81) can make undesirable contact with underling features (11).

The controlled oxide gauging can be performed during the strip process or prior to the strip process. In particular, using the fluorine memory (residual fluorine material) that exists subsequent to etching of the capping layer (30), a controlled gauging of the oxide layer (20) can be achieved whereby the fluorine memory causes very slight etching of the oxide layer (20) exposed at the bottom of the opening (81) during the stripping process to expose the hard mask layer (50). In this process, the bottom of the opening (82) may be further extended by etching of the exposed surface of the feature (12), which is desirable to ensure the contact opening is sufficiently formed down to and exposing the surface of the feature (12) to enable contact interfaces between the metal material that is subsequently deposited to fill the opening and make contact with the features (12). during later stages of BEOL fabrication.

In another exemplary embodiment of the invention, a controlled oxide gauging can be achieved prior to the stripping, by using a suitable dry etching chemistry to slightly etch the exposed oxide layer (20) at the bottom of the openings (81) while using the remaining layers (80, 70, 60) as an etch mask, followed by a de-fluorination process that eliminates residual fluorine on the chamber walls, wafer surface, and opening sidewalls. The de-flourinization facilitates retention of the underlying oxide layer (20) during the subsequent stripping process (e.g. Ashing process) where flushing of the residual fluorine before commencement of the ash processing step impedes additional etching (gouging) of the oxide layer (20) during the strip process to remove any remaining portions of the layers (80), (70) and (60). The deflourinization process preserves the oxide layer selectivity during the photoresist strip process.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method of forming an interconnect structure, comprising:
    forming an oxide layer over a surface of a semiconductor substrate having a metallic contact formed in the substrate surface, wherein an upper surface of the metallic contact is coplanar with an upper surface of the oxide layer;
    forming a nitride capping layer over the oxide layer;
    forming an interlevel dielectric (ILD) layer over the nitride capping layer;
    forming a hard mask layer over the ILD layer;
    sequentially forming an organic planarizing layer (OPL), anti reflective coating (ARC) layer and photoresist (PR) layer over the hard mask layer;
    etching first and second openings through the PR, ARC, OPL, hard mask and ILD layers down to the nitride capping layer, wherein the first opening is aligned to the metallic contact in the underlying substrate surface;
    etching the nitride capping layer exposed at bottoms of the first and second openings using the PR, ARC or OPL layer as an etch mask to a portion of the upper surface of the metallic contact through the first opening and to expose at least a portion of the upper surface of the oxide layer through the second opening;
    stripping away any remaining portion of the PR, ARC and OPL layers to expose the hard mask layer; subsequent to the etching of the nitride capping layer; and
    performing a controlled oxide gouging of the exposed surface of the oxide layer in the second opening to avoid punch through of the oxide layer to an underlying layer or feature.

* * * * *